United States Patent
Tsuchihashi

(10) Patent No.: US 7,656,632 B2
(45) Date of Patent: Feb. 2, 2010

(54) ELECTRONIC CIRCUIT INCLUDING A STEP-UP CIRCUIT AND ELECTRIC APPLIANCE COMPRISING THE SAME

(75) Inventor: Masanori Tsuchihashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 510 days.

(21) Appl. No.: 11/531,757

(22) Filed: Sep. 14, 2006

(65) Prior Publication Data

US 2007/0064364 A1    Mar. 22, 2007

(30) Foreign Application Priority Data

Sep. 16, 2005    (JP)    ............... 2005-269490

(51) Int. Cl.
*H02H 7/00*    (2006.01)
(52) U.S. Cl. .................................... 361/93.1
(58) Field of Classification Search ............... 361/93.1
See application file for complete search history.

(56) References Cited

U.S. PATENT DOCUMENTS 4,278,930 A * 7/1981 Rogers ................. 323/285
5,552,695 A * 9/1996 Schwartz ................. 323/271

FOREIGN PATENT DOCUMENTS

JP    2002-204569 A    7/2002

* cited by examiner

*Primary Examiner*—Stephen W Jackson
(74) *Attorney, Agent, or Firm*—Keating & Bennett, LLP.

(57) ABSTRACT

An electronic circuit includes a constant voltage output circuit that outputs a constant voltage and a step-up circuit including an input portion to which outputs of the constant voltage output circuit are connected and is controlled by a control circuit, an overcurrent detecting circuit that detects overcurrent when current of not less than a specified value is supplied to the constant voltage output circuit by not less than a first specified period of time, and an overcurrent protecting circuit that performs operations of protecting the constant current output circuit based on outputs of the overcurrent detecting circuit. The electronic circuit protects, in an electronic circuit using a charge pump type step-up circuit, the step-up circuit from overcurrent in abnormal conditions and achieves more rapid operations.

12 Claims, 15 Drawing Sheets

US 7,656,632 B2

ELECTRONIC CIRCUIT INCLUDING A STEP-UP CIRCUIT AND ELECTRIC APPLIANCE COMPRISING THE SAME

BACKGROUND OF THE INVENTION

1. Field of the Invention

The present invention relates to a semiconductor device including a step-up circuit, and to an electronic circuit for protecting the semiconductor device from overcurrent flowing between voltage input terminals and voltage output terminals of the semiconductor device.

2. Description of the Related Art

When an input portion and an output portion of a step-up circuit of a charge pump type are short-circuited, overcurrent will flow through the input portion and the output portion so that the semiconductor device including the step-up circuit may become inoperative.

As shown in FIG. 15, there has been used a means as disclosed in Japanese Unexamined Patent Application Publication No. 2002-204569 such that a regulator 16 including an overcurrent protecting circuit was provided between an input portion Vbatt and a step-up circuit 12 in order to prevent overcurrent generated by short-circuiting or the like from flowing through step-up circuit 12, and to prevent the step-up circuit 12 from being damaged by the overcurrent. The charge pump circuit 10 further includes a control circuit 14, capacitors 18 and 20, an output capacitor 22, and a load 24.

By providing the overcurrent protecting circuit at the input portion Vbatt and at a voltage input portion Vin of the step-up circuit 12, it is also possible to protect the circuit in the presence of overcurrent caused by short-circuiting or the like between the input terminals and the output terminals of a switching circuit portion.

However, by merely providing a regulator 16 having a conventional overcurrent protecting circuit, the overcurrent protecting circuit may erroneously recognize that overcurrent has occurred when current is supplied from an input power source 2B to a capacitance through rectifier elements defining the step-up circuit 12. This can interrupt the supply of current or limit the amount of supplied current.

Accordingly, by merely providing a regulator including an overcurrent protecting circuit at the power source input portion of a charge pump type step-up circuit, a sufficient current may not be supplied to the capacitive element, resulting in delays in obtaining a specified amount of output voltage in the charge pump type step-up circuit including the regulator provided with an overcurrent protecting circuit.

SUMMARY OF THE INVENTION

In order to overcome the problems described above, preferred embodiments of the present invention are capable of protecting, in an electronic circuit using a charge pump type step-up circuit, the step-up circuit from overcurrent in a case of abnormal conditions and are also capable of providing much faster operations than before when operating in a normal condition.

A first preferred embodiment of the present invention relates to an electronic circuit including a constant voltage output circuit that outputs a constant voltage and a step-up circuit including an input portion to which outputs of the constant voltage output circuit are connected and whose switches are controlled by a control circuit, wherein the constant voltage output circuit includes an overcurrent detecting circuit that detects an overcurrent when current of not less than a specified value is supplied for not less than a first specified period of time and an overcurrent protecting circuit protects the constant current output circuit based on outputs of the overcurrent detecting circuit.

Further, according to the first preferred embodiment of the present invention, the step-up circuit may include a control circuit that outputs control signals based on inputs of clock signals which are of constant frequency, a group of rectifier elements arranged between the input portion and a voltage output portion in which N-number of rectifier elements are connected in series while anode terminals are connected to the input portion side, a first group of capacitive elements having first ends connected to the cathode terminals of odd-numbered rectifier elements from the input portion side and having second ends receive input of first control signals that are output from the control circuit, and a second group of capacitive elements having first ends connected to cathode terminals of even-numbered rectifier elements from the voltage input portion side and having second ends receive input of second control signals having an inverse phase relative to that of the first control signals that are output from the control circuit, wherein the step-up circuit boosts the voltage input from the voltage input portion and outputs the boosted voltage from the voltage output portion in accordance with the first and second control signals.

Moreover, the first preferred embodiment of the present invention may preferably further include an overcurrent detecting circuit that starts overcurrent detecting operations based on the first control signals or second control signals.

Still further, the first preferred embodiment of the present invention may further include an overcurrent detecting circuit wherein the first specified period of time is a period of the control signals.

Still further, the first preferred embodiment of the present invention may further include a delay circuit that terminates operation of the electronic circuit for protection at a second specified period of time after power activation.

Moreover, the first preferred embodiment of the present invention may alternatively be arranged in that the control circuit includes a sampling circuit to which periodic signals and signals corresponding to voltages of the voltage output portion of the step-up circuit are input; a comparison circuit that compares first comparative signals that are based on returned signals and the periodic signals as output from the sampling circuit and second comparative signals that are based on the periodic signals and trigger signals as generated in the sampling circuit; a drive circuit to which coincident signals as output from the comparison circuit and the trigger signals are input; and a first switch and a second switch that output first and second control signals, the first switch and the second switch being controlled by the drive circuit such that they become complementarily conductive/non-conductive when the returned signals and the trigger signals coincide and being controlled by the drive circuit to be both non-conductive when the returned signals and the trigger signals do not coincide.

A second preferred embodiment of the present invention relates to an electronic circuit including a step-up circuit that boosts voltage as input from a voltage input portion and outputs the boosted voltage through voltage output terminals in accordance with first and second control signals, further including a control circuit that outputs control signals based on inputs of clock signals that are of constant frequency; a group of rectifier elements arranged between the voltage input portion and the voltage output portion in which N-number of rectifier elements are connected in series while anode terminals are connected to the voltage input portion side; a first group of capacitive elements having first ends connected to cathode terminals of odd-numbered rectifier elements from the voltage input portion side and having second ends receive input of the first control signals as output from the control circuit; a second group of capacitive elements having first ends connected to even-numbered rectifier elements from the voltage input portion side and having second ends receive input of second control signals having an inverse phase relative to that of the first control signals that are output from the control circuit, wherein the control circuit includes a sampling circuit to which periodic signals and signals corresponding to voltages of the voltage output portion of the step-up circuit are input; a comparison circuit that compares first comparative signals that are based on returned signals and the periodic signals as output from the sampling circuit and second comparative signals that are based on the periodic signals and trigger signals as generated in the sampling circuit; a drive circuit to which coincident signals as output from the comparison circuit and the trigger signals are input, and a first switch and a second switch for outputting first and second control signals, the first switch and the second switch being controlled by the drive circuit such that they become complementarily conductive/non-conductive when the returned signals and the trigger signals coincide and are controlled by the drive circuit that they both become non-conductive when the returned signals and the trigger signals do not coincide.

Further, the first and second preferred embodiments of the present invention may include rectifier elements including a first-conductive type semiconductor substrate, a first second-conductive type region provided on the semiconductor substrate, a second second-conductive type region provided below the first second-conductive type region, a first first-conductive type region provided within the first second-conductive type region, a third second-conductive type region provided at an edge portion of the first second-conductive type region and contacts the second second-conductive type region at a lower end portion of the third second-conductive type region, a second first-conductive type region provided within the first second-conductive type region between the first first-conductive region and the third second-conductive type region, wherein first terminals of the rectifier elements are connected to the first first-conductive type region and second terminals are connected to the third second-conductive type region and the second first-conductive type region.

Moreover, the first and second preferred embodiments of the present invention may preferably include rectifier elements in which the first-conductive type is a P-type conductor and the second-conductive type is an N-type conductor. Anode terminals of the rectifier elements are connected to the first first-conductive type region, and cathode terminals are connected to the third second-conductive type region and the second first-conductive type region.

Moreover, the first and second preferred embodiments of the present invention may also include rectifier elements in which the first-conductive type is an N-type conductor and the second-conductive type is a P-type conductor. Cathode terminals of the rectifier elements are connected to the first first-conductive type region, and anode terminals are connected to the third second-conductive type region and the second first-conductive type region.

Further, the first and second preferred embodiments of the present invention may be used in an electronic circuit including a third switch including input terminals, output terminals and control terminals; a switch drive circuit having input portions connected to outputs of the electronic circuit and driving the control terminals of a third switch at a voltage that is higher than the voltage applied to the input terminals of a first switch; and a switch drive control circuit that controls the switch drive circuit.

Further, the first and second preferred embodiments of the present invention may be used in an electronic appliance including a third switch including input terminals, output terminals and control terminals; a switch drive circuit that drives the control terminals of the third switch at a voltage that is higher than the voltage applied to input terminals of the third switch; a switch drive control circuit that controls the switch drive circuit; and a fourth switch including control terminals to which signals opposite in phase to signals applied to the control terminals of the third switch are input, terminals that are connected to the output terminals, and terminals applied with a reference potential; wherein the electronic circuit is connected to the switch drive circuit.

The first and second preferred embodiments of the present invention may also be used in a motor control circuit including a group of switches including a plurality of switches provided with input terminals, output terminals and control terminals; a switch drive circuit that drives the control terminals of the switches at a voltage that is higher than the voltage applied to the input terminals of the switches of the groups of switches; a switch drive control circuit that controls the switch drive circuit; and the electronic circuit connected to the switch drive circuit, wherein the motor control circuit further includes a switch drive circuit that controls a motor that is controlled upon conduction/non-conduction of the groups of switches.

By providing a constant voltage output circuit provided with an overcurrent protecting circuit including a timer provided at an input portion or a control portion of a charge pump type step-up circuit, it is possible to protect an electronic circuit that includes the charge pump type step-up circuit and also to output a specified voltage at an early stage when compared to a conventional charge pump type step-up circuit when operating in a normal condition.

Since it will accordingly be possible to start a drive circuit without delay after start-up of a control circuit or the like while protecting the electronic circuit from overcurrent, it is possible to minimize deficiencies at the time of start-up of the electronic circuit and malfunctions of electric appliances using the same.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

According to preferred embodiments of the present invention, it is possible to achieve a specified output at an early stage by preventing current exceeding a specified value from flowing by providing a constant voltage output circuit having an overcurrent protecting circuit including a timer at an input portion of a charge pump type step-up circuit, and to achieve more reliable overcurrent protection by providing a control circuit for controlling the charge pump type step-up circuit with an overcurrent detecting function.

Figure 1:
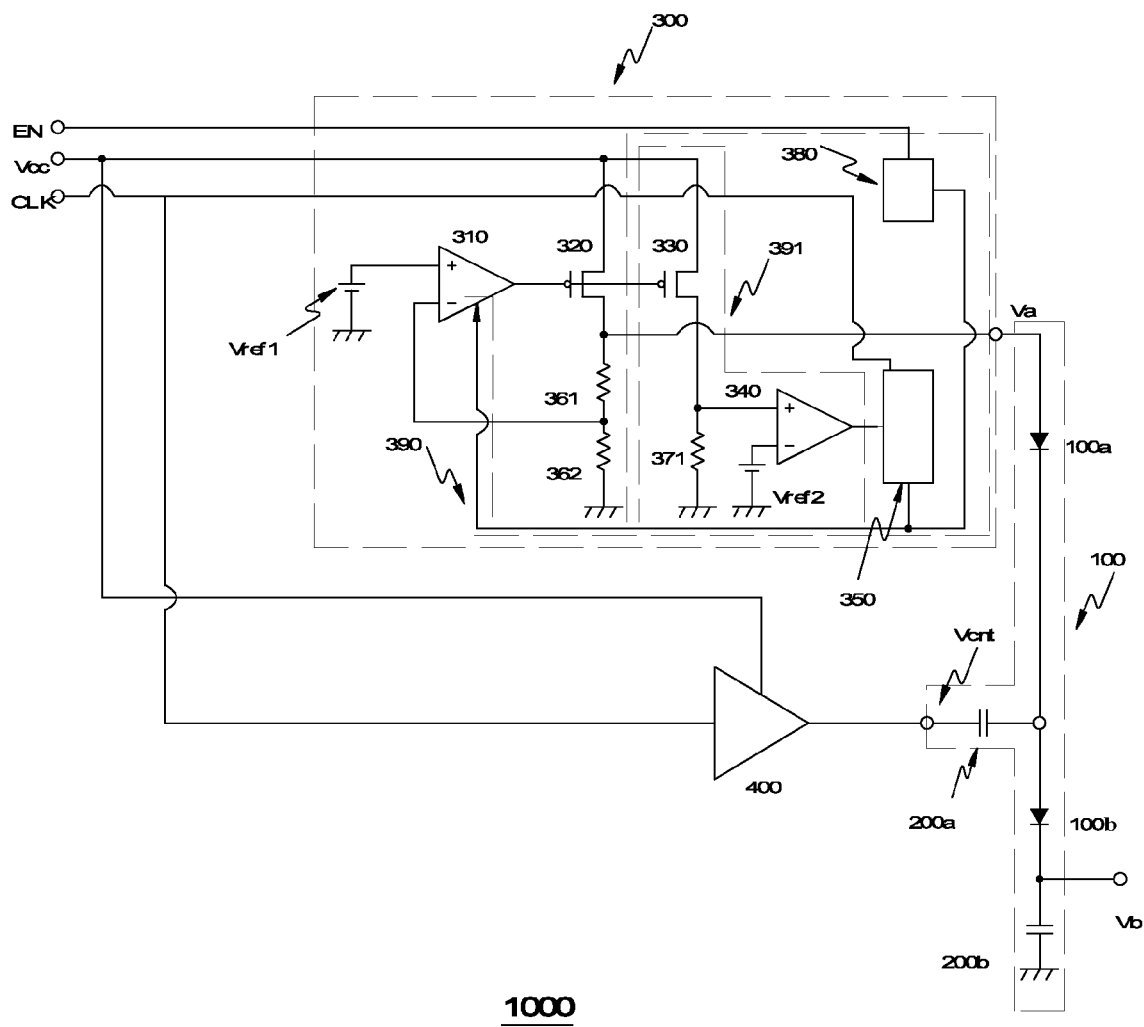
FIG. 1 is a circuit diagram of an electronic circuit according to a preferred embodiment of the present invention.

FIG. 1 is a view showing an arrangement of a first preferred embodiment of the semiconductor device according to the present invention. An electronic circuit 1000 includes a step-up circuit 100 having a group of rectifier elements 100a, 100b, first capacitive element 200a, and second capacitive element 200b; a constant voltage output circuit 300; and a control circuit 400.

The step-up circuit 100 is arranged by serially connecting two rectifier elements 100a, 100b whose anode terminals are connected to, for instance, a power input portion side between a voltage input portion Va and a voltage output portion Vb.

A first stage includes a capacitive element 200a having one end connected to a cathode terminal of an odd-numbered element, for instance, a first rectifier element 100a from the voltage input portion Va and having the other end receive input from a first control signal Vcnt based on a clock signal XL.

A second stage includes a second capacitive element 200b having one end connected to a cathode element of an even-numbered element, for instance, a second rectifier element 100b from the voltage input terminal Vcc and having the other end receive input from a second control signal or a ground potential opposite in phase to the first control signal Vcnt.

In this respect, while the present preferred embodiment illustrates a case in which two rectifier elements are used, when further boosting is desired, a capacitance is connected to a cathode terminal of the rectifier element such that the first control signal Vcnt is input to another end of an odd-numbered capacitive element from the voltage input portion side while a second control signal or a ground potential having an inverse potential relative to that of the first control signal Vcnt is input to an even-numbered capacitive element.

A voltage V3, which is a sum of a voltage corresponding to the first power voltage V1 applied to the power voltage portion Vcc multiplied by the number of rectifier elements and the second power voltage V2 applied to the power input portion Va, is output to the power output portion Vb.

The constant voltage circuit 300 includes a constant voltage generating portion, an overcurrent detecting circuit 391, and an overcurrent protecting circuit portion including the same.

The constant voltage generating portion includes a first amp 310 whose non-inverted terminals are applied with a first reference voltage Vref1 and whose inverted terminals are applied with a voltage input divided by a first resistance 361 and a second resistance 362, and an output transistor 320 in which the power voltage portion Vcc is connected to a source region, the voltage input portion Va is connected to a drain region, and outputs of the amp 310 are connected to gate electrodes.

The overcurrent detecting circuit 391 includes a monitor transistor 330 in which the power voltage portion Vcc is connected to a drain region, one end of a third resistance 371 whose other end is grounded is connected to a source region, and outputs of the first amp 310 are connected to gate terminals, and a second amp 340 in which a connecting point between a drain of the monitor transistor 330 and the resistance 371 is applied to non-inverted terminals, and a second reference voltage Vref is applied to inverted terminals.

The overcurrent protecting circuit 390 includes the overcurrent detecting circuit 391, a timer circuit 350 to which clock signals XL input from clock terminals CLK and second amp signals 340 are input, and a delay circuit 380 to which enable signals EN are input, wherein outputs of the timer circuit 350 are connected to the first amp 310 while outputs of the delay circuit 380 are connected to the timer circuit 350.

Operations of the electronic circuit 1000 when no overcurrent is present will now be explained. When a clock signal XL of high level is input to the clock terminal CLK, the second power voltage V2 output from the constant voltage output circuit 300 is applied to a capacitive element 200a. Next, when a low-level clock signal is input to the clock terminal CLK, the first power voltage V1 supplied from the power voltage portion Vcc is input to the terminal side that is not connected to diodes. The voltage on the diode connecting side is raised to second power voltage V2+first power voltage V1. A specified output voltage V3 is output to the voltage output portion Vb.

Overcurrent Id is then made to flow to the output transistor 320 of the constant voltage output circuit 300 and a current Iov corresponding to the current Id is also made to flow to the monitor transistor 330 and also to the third resistance 371. A voltage V5 corresponding to the overcurrent Id is output to one end of the third resistance 371.

A voltage V5 corresponding to the overcurrent Id is output to a non-inverted terminal of the second amp 340 to which a connecting point of the third resistance 371 and the monitor transistor 330 is connected. Through flow of overcurrent and when the voltage V5 that is applied to the non-inverted terminal is not less than the reference voltage Vref2, the second amp outputs high level.

The timer circuit 350 receives the high level signal from the second amp 340 to make the overcurrent protecting circuit 390 during one period of the clock signal XL not perform overcurrent protecting operations (overcurrent protecting signal Valt does not change). Since operation of the output transistor is terminated through the overcurrent protecting circuit 390 even if a large current is made to flow from the output transistor via the rectifier element 100a, it is possible to sufficiently supply current to the capacitive element 200a so that boosting will not be interrupted. The time required for boosting can accordingly be shortened.

Not only at the time of boosting during start-up, but also in the presence of pulse-like noise upon input of clock signals XL and during operation of the charge pump type step-up circuit 100, no overcurrent is recognized when the noise does not exceed the clock period, operations will not be interrupted by the overcurrent protecting circuit 390. It is accordingly possible to minimize malfunctions when compared to the prior art.

On the other hand, in case of an abnormal condition in which the power voltage portion Vb is in a ground fault condition in which it is short-circuited to the ground potential or in a power line fault condition in which the voltage output portion is short-circuited to the power potential for longer than a single period of the clock signal XL so that overcurrent is caused, the timer circuit 350 terminates operation of the first amp 310. In this manner, since the overcurrent protecting circuit 390 starts operation in case of such ground fault conditions or power line fault conditions over a long period of time in which deficiencies may be caused in the electronic circuit when overcurrent flowing to the electronic circuit will exceed rated values of the elements, boosting operations are resumed after termination of the abnormal condition so that the specified voltage can be output.

Figure 2:
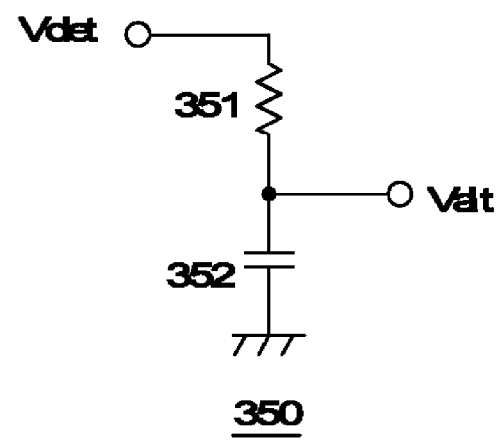
FIG. 2 is a circuit diagram of a timer circuit according to a preferred embodiment of the present invention.

The timer circuit 350 includes a resistance 351 to which outputs Vdet of the second amp 340 are connected at one end as, for instance, shown in FIG. 2, and a capacitor 352 to which the other end of the resistance 351 is connected at one end and whose other end is connected to the ground potential, and the specified time is set by adjusting a resistance value of the resistance 351 or a capacitance value of the capacitor 352. In such an instance, the input to the timer circuit 350 from the clock terminals are omitted in FIG. 1.

Figure 3:
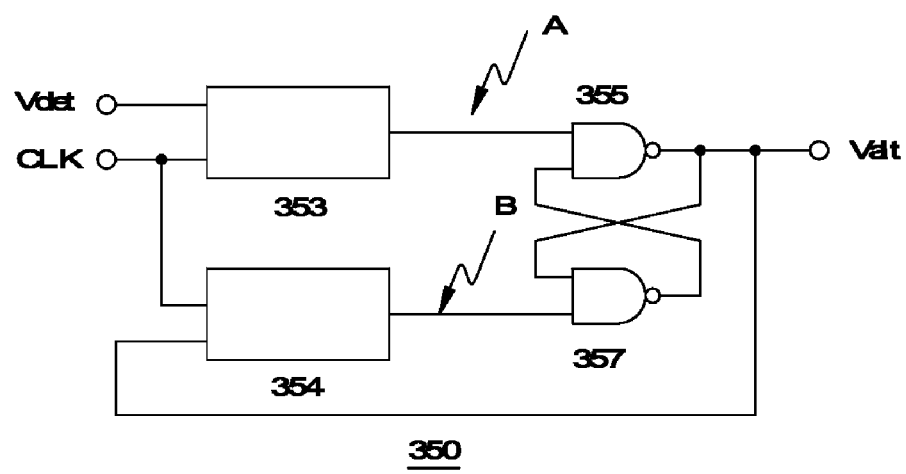
FIG. 3 is a circuit diagram of a timer circuit illustrating another preferred embodiment according to the present invention.

FIG. 3 illustrates another preferred embodiment of the timer circuit 350. It includes a first counter 353 for timing a specified time during which the overcurrent detecting signal Vdet from the second amp 340 and the clock signal Xl from the clock terminal CLK are input, a second counter 354 for timing a specified time during which the overcurrent protecting signal Valt and the clock signal XL are input, and logic ANDs 355, 357 to which output signals A, B from the respective counters and mutual outputs thereof are input.

Figure 4:
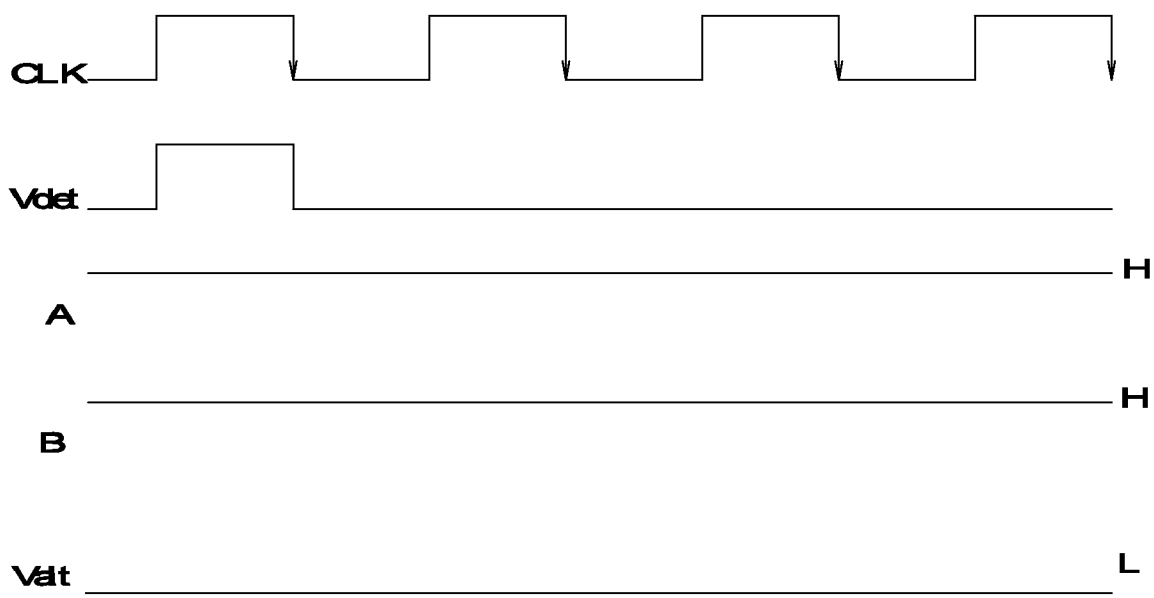
FIG. 4 is a view showing operations of the timer circuit in a normal condition.

FIG. 4 shows conditions of respective signals in case the overcurrent detecting signal Vdet is less than one clock period. The first counter 353 changes the specified time signal to low level when overcurrent detecting signals are received for not less than one clock period. Since no change takes place when the signals are received for less than one clock period, intermediate signals A, B remain high level. Since the overcurrent protecting signal Valt does not change either, no overcurrent protecting operations are performed.

Figure 5:
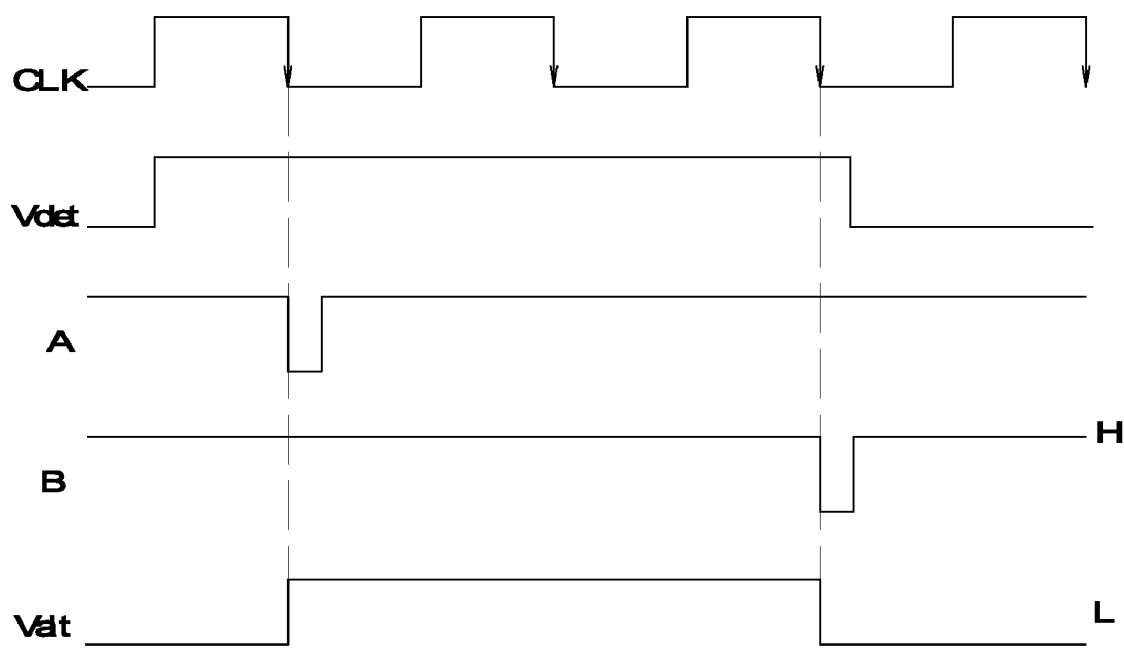
FIG. 5 is a view showing operations of the timer circuit in an abnormal condition.

FIG. 5 shows conditions of respective signals in case the overcurrent detecting circuit Vdet is not less than one clock period. The counter 353 changes the specified time signal to low level when overcurrent detecting signals are received for not less than one clock period. Since change takes place when the signals are received for less than one clock period, the intermediate signal A will first become low level, and the overcurrent protecting signal Valt also changes therewith. In accordance with this, the counter 354 starts timing based on the clock signal XL to output an intermediate signal B of low level after elapse of a specified time so as to terminate the overcurrent protecting condition.

The timer circuit 350 as shown in FIG. 3 is linked with signals Vent for controlling the step-up circuit 100. This is desirable since no fluctuations are thus affected by capacitances, resistances, or current sources etc., and since the circuit dimension is small.

Figure 6:
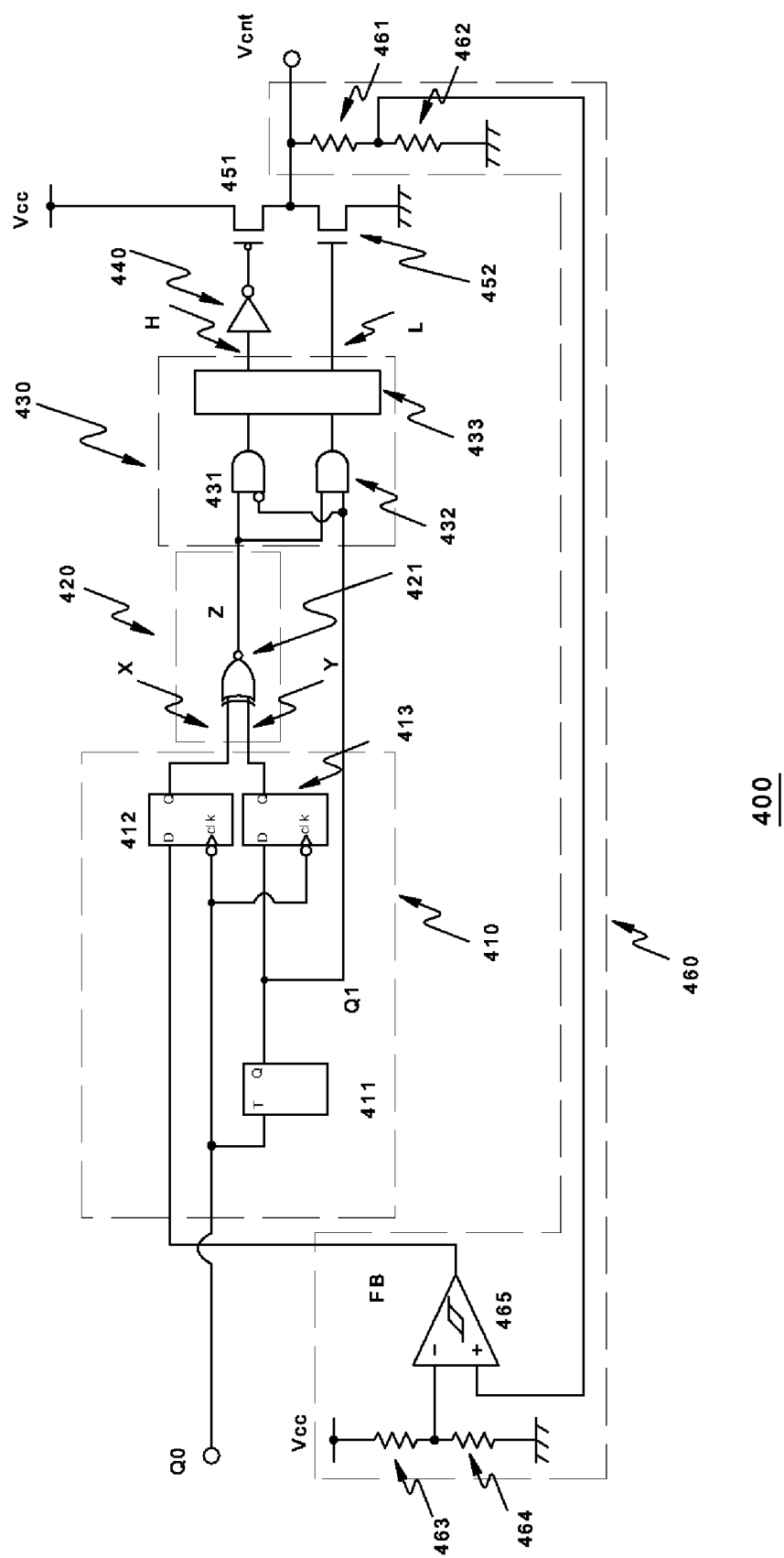
FIG. 6 is a circuit diagram of a control circuit according to a preferred embodiment of the present invention.

FIG. 6 specifically shows a structure of the control circuit 400. The control circuit 400 includes a sampling circuit 410, a comparison circuit 420, a drive circuit 430, an inversion circuit 440, a first switch 451, and a second switch 452.

The sampling circuit 410 includes a trigger signal generating circuit 411 that outputs trigger signals Q1 having half a frequency through a frequency-dividing frequency signal Q0, a first sampling circuit 412 which is a negative edge D flip flop that samples returned signals FB through periodic signals, and a second sampling circuit 413 which is a negative edge D flip flop that samples trigger signals through periodic signals. First comparison signals X are output from the first sampling circuit 412 for use in the comparison circuit 420 while second comparison signals Y are output from the second sampling circuit 413 for use in comparison circuit 420.

The comparison circuit 420 includes a coincidence circuit 421 so as to output signals that fluctuate depending on whether the first comparative signals X and the second comparative signals Y output from the sampling circuit 410 coincide or not, and outputs coincident signals Z reflecting whether the returned signals and periodic signals coincide or not.

The drive circuit 430 includes a first logic AND circuit 431 inputted with inverted signals of the coincident signals Z output from the comparison circuit 420 and the trigger signals Q1 output from the sampling circuit 410, and a second logic AND circuit 432 inputted with coincident signals Z output from the comparison circuit 420 and trigger signals Q1 output from the sampling circuit 410, wherein outputs from the respective logic ANDs are level-shifted by an output level shift circuit 433 such that the first switch and the second switch can be driven. The output level shift circuit 433 outputs first driving signals H for controlling conduction/non-conduction of the first switch 451 and second driving signals L for controlling conduction/non-conduction of the second switch 452.

In this respect, the control circuit 400 includes a return level shift circuit 460 for adjusting the voltage so as to match output voltages as signals that are input to the sampling circuit 410 as returned signals.

The return level shift circuit 460 can accordingly output returned signals FB from comparator 465 that match the signals used in the sampling circuit 410. For instance, when voltages output from the control terminals Vent are 0 to 24V and the voltages used in the sampling circuit 410 are 0 to 5V, respective resistance values can be arbitrarily set to required levels, for instance, resistance 461: resistance 462=9:1 or resistance 463: resistance 464=19:1.

Figure 7:
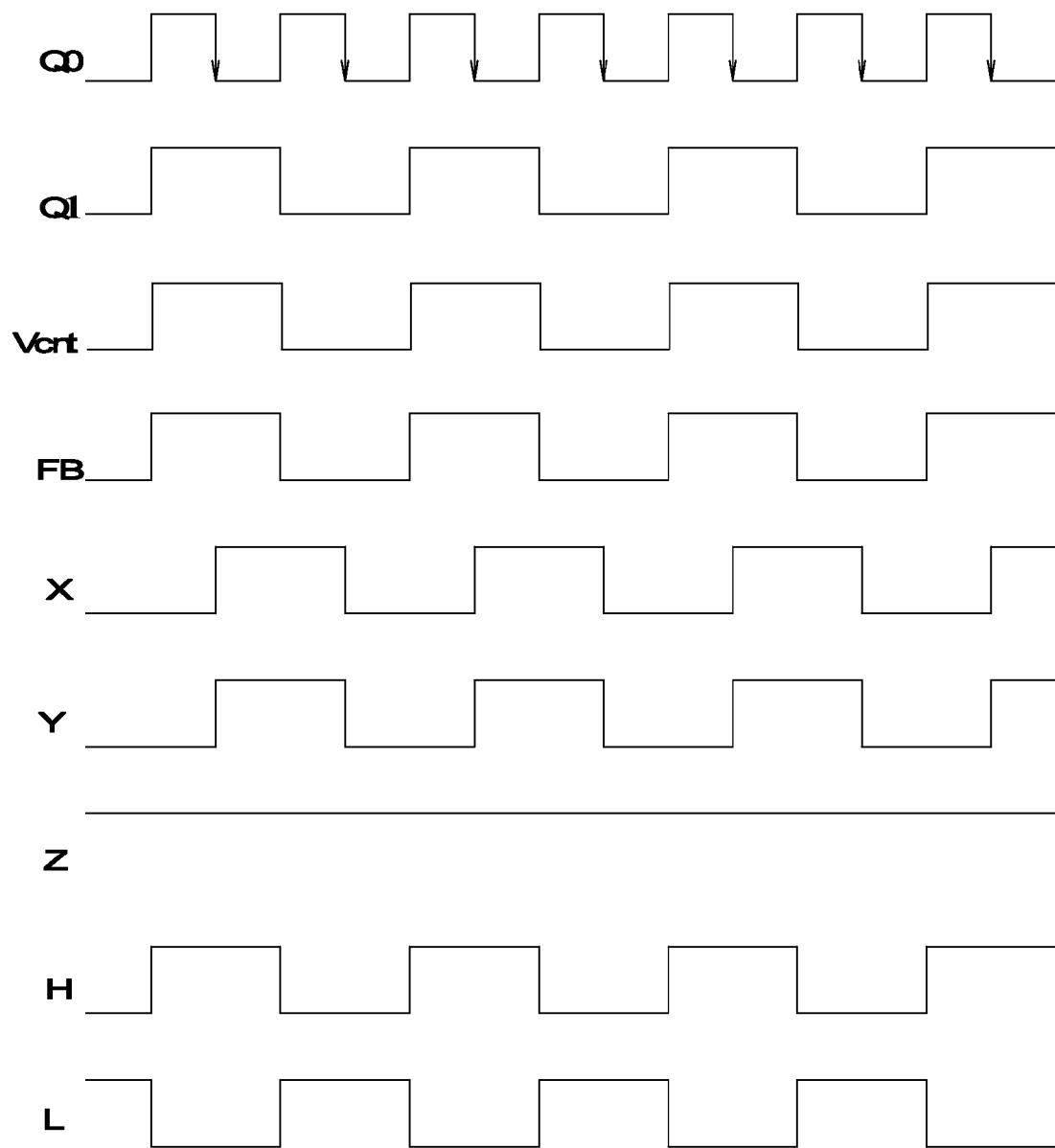
FIG. 7 is a view showing operations of the control circuit in a normal condition.

FIG. 7 shows conditions of respective signals when operating in the normal condition. The first sampling circuit samples the returned signals FB at negative edges of the periodic signals Q0 (timings changing from high level to low level) for outputting first comparative signals X. The second sampling circuit samples the trigger signals Q1 at negative edges of the periodic signals Q0 for outputting second comparative signals Y. Since the returned signals FB usually operate based on changes of the trigger signals Q1, the first comparative signals and the second comparative signals coincide. The comparison circuit 420 will accordingly output high level signals which are coincident signals. Since high level signals are output to both of the first logic AND 431 and the second logic AND 432, the first logic AND 431 and the second logic AND 432 will output first driving signals H and second driving signals L that are inversed with respect to each other through changes of the trigger signals Q1. Since the first switch is controlled by inversed signals of the first driving signals and the second switch by the second driving signals, either one of the first switch or the second switch will become conductive so that switching operations can be normally performed.

Figure 8:
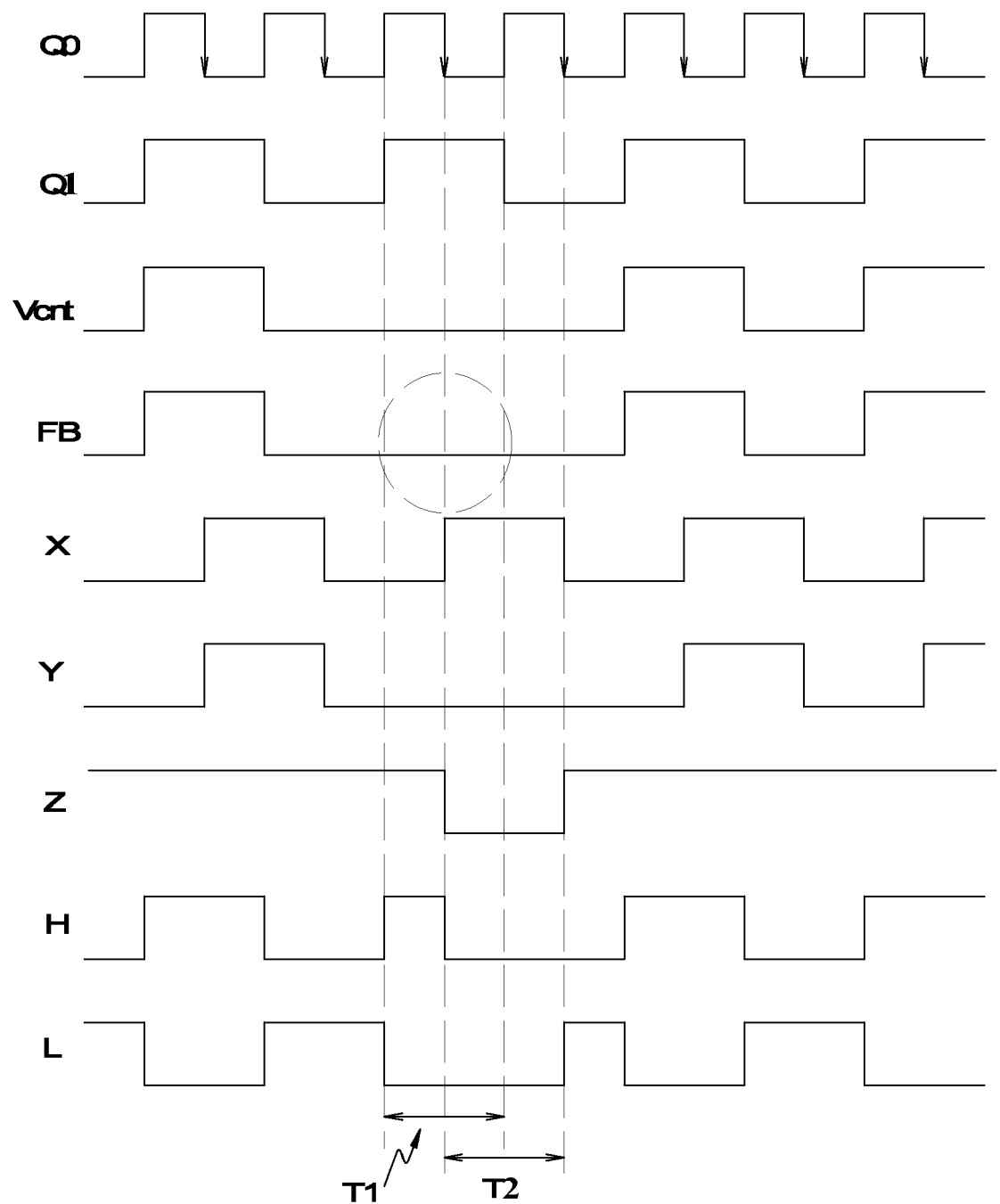
FIG. 8 is a view showing operations of the control circuit in an abnormal condition (ground fault) mode.

FIG. 8 shows conditions of respective signals in the presence of a ground fault condition. For instance, the control terminals Vcnt are in a ground fault condition (low level) during a first period T1. In second period T2, low level first comparative signals X are output. In the second period T2, the second sampling circuit 413 samples the trigger signals Q1 at negative edges of the periodic signals Q0 for outputting the second control signals Y. The second sampling circuit 413 outputs high level second comparative signals Y in correspondence with the trigger signals Q1 also during the second period T2 which is a ground fault condition. In the second period T2, the first comparative signals X and the second comparative signals Y are non-coincident. The comparison circuit 420 will accordingly output low level coincident signals during second period T2. Since low level signals will be output to both of the first logic AND 431 and the second logic AND 432 during the second period T2, both of the first logic AND 431 and the second logic AND 432 of the drive circuit 430 will output low level first driving signals and second driving signals during the second period T2. The first switch 451 is controlled by inverted signals of the first driving signals H and the second switch 452 by the second driving signals L, both of the first switch 451 and the second switch 452 will become non-conductive during the second period T2 so that it is possible to perform control such that no more output current is made to flow to portions that include capacitances and rectifier elements.

Figure 9:
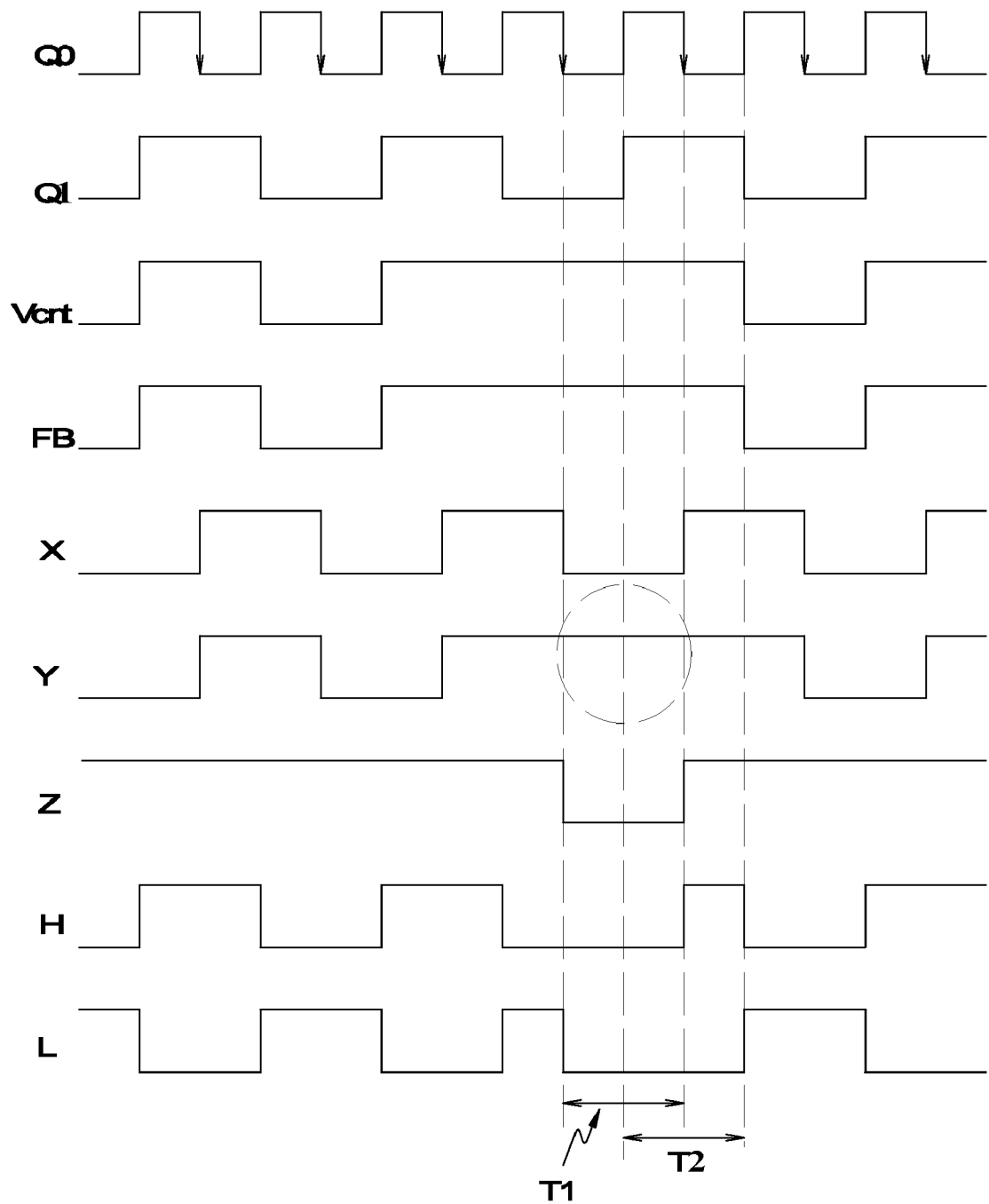
FIG. 9 is a view showing operations of the control circuit in an abnormal condition (power line fault) mode.

FIG. 9 shows conditions of respective signals in the presence of a power line fault condition. For instance, the control terminals Vcnt are in a power line fault condition (high level) during the first period T1. In the second period T2, high level first comparative signals X are output. In the second period T2, the second sampling circuit 413 samples the trigger signals Q1 at negative edges of the periodic signals Q0 for outputting the second control signals Y. The second sampling circuit 413 outputs low level second comparative signals Y in correspondence with the trigger signals Q1 also during the second period T2 which is a power line fault condition. In the second period T2, the first comparative signals X and the second comparative signals Y are non-coincident. The comparison circuit 420 will accordingly output low level coincident signals during second period T2. Since low level signals will be output to both of the first logic AND 431 and the second logic AND 432 during the second period T2, both of the first logic AND 431 and the second logic AND 432 will output low level first driving signals and second driving signals during the second period T2. The first switch 451 is controlled by inverted signals of the first driving signals H and the second switch 452 by the second driving signals L, both of the first switch 451 and the second switch 452 will become non-conductive during the second period T2 so that it is possible to perform control such that no more output current is made to flow to portions that include capacitances and rectifier elements.

It is accordingly possible to substantially terminate the electronic circuit in ground fault conditions and power line conditions of clock periods, and using the electronic circuit in combination with the timer circuit 350, it is possible to protect the same from ground faults and power line faults in substantially every period.

Figure 10:
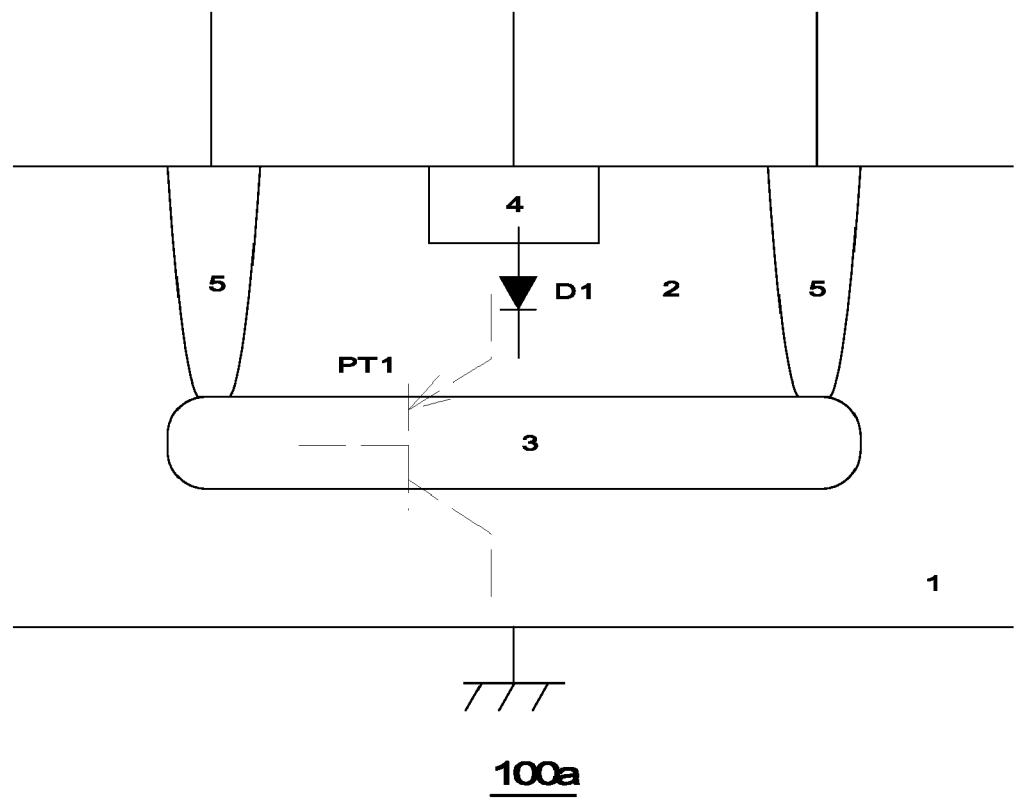
FIG. 10 is a sectional schematic view showing conventional rectifier elements.

As shown in FIG. 10, conventional rectifier elements 100a are arranged such that a rectifier element D1 includes a first N-type region 2 formed on a P-type semiconductor substrate 1, a second N-type region 3 which is an embedding layer provided below the first N-type region 2, a first P-type region 4 connected to anode terminals and formed on the first N-type region 2, and third N-type regions 5, which are element isolated regions that are connected to cathode terminals, formed at edge portions of the first N-type region 2 and that are in contact with the second N-type region 3 at their lower end portions.

The P-type semiconductor substrate 1 is used in a grounded manner as shown in FIG. 10. At this time, a PNP transistor PT1 is parasitically formed through the first P-type region 4 and the first N-type region 2 as well as the second N-type region 3 and the P-type semiconductor substrate 1.

When operating as the rectifier element 100a, the voltage applied to an emitter of a transistor PT will be higher than the voltage applied to a base of the transistor PT so that the transistor PT1 is also operated. More particularly, a portion of the current that flows to the third N-type regions 5 and further to the capacitive elements through the cathode elements will flow to grounding portions through the P-type semiconductor substrate 1. Therefore, it will take extra time for stored charges of capacitances connected to the cathodes of the rectifier elements until the output voltage reaches a specific potential so that the start-up time becomes delayed.

Figure 11:
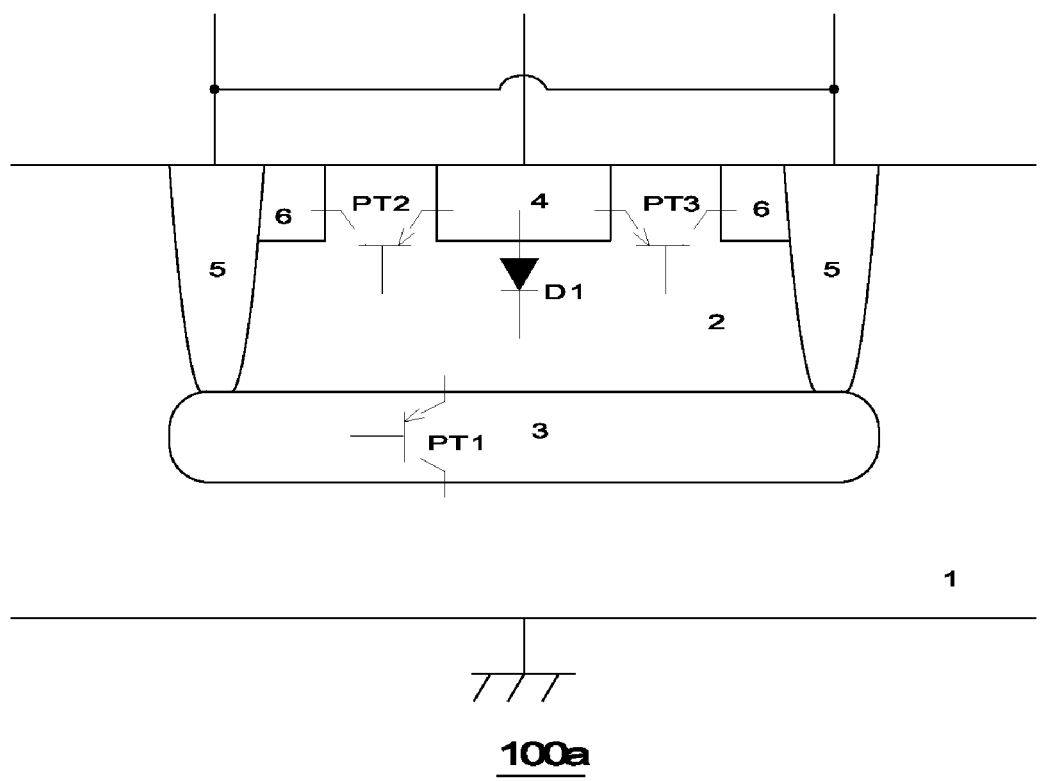
FIG. 11 is a sectional schematic view of rectifier elements used in a step-up circuit according to a preferred embodiment of the present invention.

FIG. 11 shows rectifier elements according to preferred embodiments of the present invention, the rectifier elements being formed of a first N-type region 2 formed on a P-type semiconductor substrate 1, a second N-type region 3 which is an embedding layer provided below the first N-type region 2, a first P-type region 4 connected to anode terminals and formed on the first N-type region 2, third N-type regions 5, which are element isolated regions that are connected to cathode terminals, formed at edge portions of the first N-type region 2 and that are in contact with the second N-type region 3 at their lower end portions, and a second P-type region 6 that is connected to cathode elements between the first P-type region 4 and the third N-type regions 5.

By providing the second P-type region 6 between the first P-type region 4 and the third N-type region 5, PNP transistors PT2 and PT3 are parasitically defined by the first P-type region 4, the first N-type region 2, and the second P-type region 6 on the surface of the substrate for restricting start-up of a PNP transistor PT1 formed from the anode terminals to the grounding terminals in a longitudinal direction across the section of the substrate, as shown in FIG. 11. Further, the second P-type region 6 is connected to the cathode terminals of the rectifier elements.

In this case, the transistors PT2 and PT3 are started up prior to PT1 and since they are connected to the cathode terminals. Current, when present, is restricted from flowing to the semiconductor substrate 1 via the PT1 but flows to the capacitive elements connected to the cathode terminals, and thus, it is possible to accelerate the start-up time.

While the second P-type region 6 is separated into two portions in FIG. 11, it may be of a different separated type, or alternatively be integral in a flat ring-like or rectangular shape. Further, while the third N-type region 5 and the second P-type region 6 are arranged to be in contact with each other in FIG. 11, they may not be in contact with each other unless both regions are connected to cathode terminals. Moreover, the rectifier elements of FIG. 11 may also be arranged in which the P-type conductors and the N-type conductors are inversed whereupon the ground and the power source as well as the anodes and cathodes are interchanged.

Figure 12:
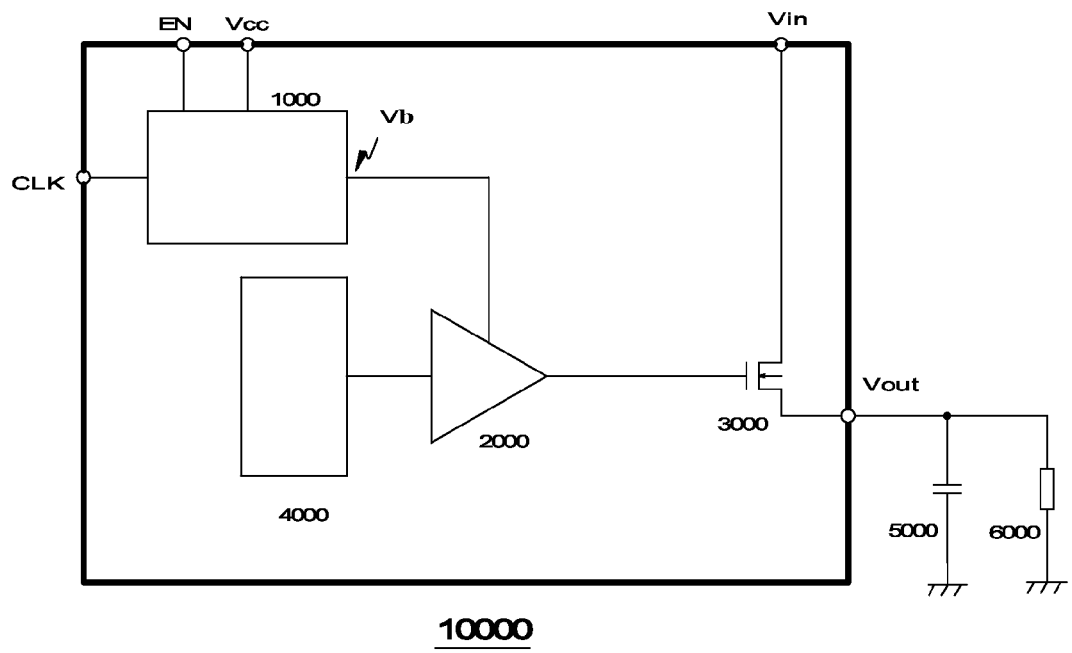
FIG. 12 is a circuit view of a switching power source device using the step-up circuit according to a preferred embodiment of the present invention.

FIG. 12 shows a switching power device 10000 according to a preferred embodiment of the present invention that includes a first switch 3000 including input terminals, output terminals, and control terminals; a switch drive circuit 2000 that drives the control terminals of the first switch 3000 at a voltage that is higher than the voltage applied to the input terminals of the first switch 3000; a driving control circuit 4000 that controls the switch drive circuit 2000; and the step-up circuit 1000 as shown in FIG. 1. A capacitive element 5000 and a load 6000 are connected to an output terminal Vout thereof while the other ends of the capacitive element 5000 and the load 6000 are connected to a ground potential.

Upon input of a first power voltage V1 to the voltage input terminals Vcc of the switching power source 10000 of the present preferred embodiment, the capacitance maybe charged at a faster speed when compared to the prior art so that the switching drive circuit 2000 can be started up more quickly when compared to the prior art in which voltages that are first boosted by a charge pump are output.

Accordingly, since outputs of the step-up circuit 1000 are input to the switch drive circuit 2000, it is possible to reduce drawbacks in which the switch drive circuit 2000 is started up later than the switch drive control circuit 4000 so that malfunctions in the switching power device 10000 as shown in FIG. 12 can be reduced. Moreover, since it includes the overcurrent protecting circuit 390, it will also be possible to minimize malfunctions of the electronic circuit 1000 in the presence of an overcurrent.

In this respect, it is also possible to use an arrangement in which feedback of outputs of the switching power device 10000 are input to the switch drive control circuit 4000 for controlling the switch drive circuit 2000 based on signals thereof. It is also possible to perform control based on signals from a sensor, or control signals based on memory elements using microcomputers or the like.

Figure 13:
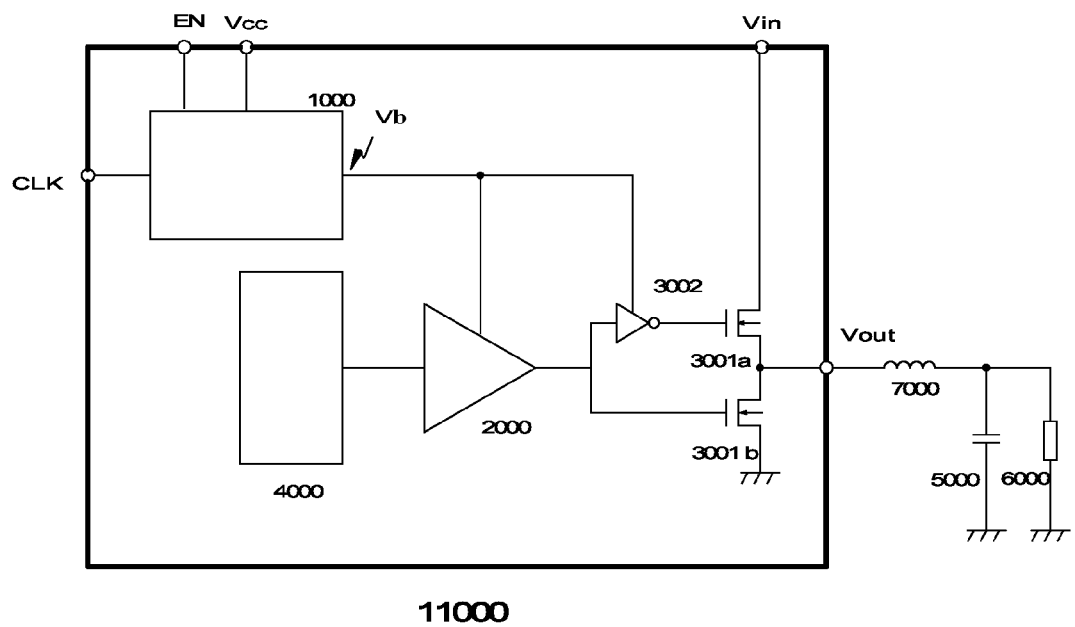
FIG. 13 is a circuit diagram of an electric appliance using the step-up circuit according to another preferred embodiment of the present invention.

FIG. 13 shows a second switching power source device 11000 of another preferred embodiment that includes a third switch 3001a made of an N-type MOS including input terminals, output terminals, and control terminals; an inverter 3002; a switch drive circuit 2000 that controls control terminals of the third switch 3001a and a fourth switch 3001b at a voltage that is higher than a voltage that is applied to input terminals of the fourth switch 3001b; a switch drive control circuit 4000 that controls the switch drive circuit 2000; a fourth switch 3001b of an N-type MOS including control terminals to which signals of opposite phase to that of signals applied to the control terminals of the third switch 3001a, terminals that are connected to the output terminals, and terminals to which a reference potential is applied; and the step-up circuit 1000 as shown in FIG. 1 that is connected to the drive circuit 2000.

First ends of inductors 7000 are connected to output terminals Vout thereof while a load 6000 and a capacitance 5000 of an electric appliance or the like are connected to the other end of the inductors 7000.

Feedback of outputs of the semiconductor device is input to the control circuit, and the control circuit may be controlled based on such signals. Control may also be based on signals output from a sensor or control signals based on memory elements using a microcomputer or the like.

While the output transistor may include a P channel type transistor and an N channel type transistor for performing complementary control, use of an N channel type transistor charge and a pump-type step-up circuit according to the preferred embodiments of the present invention is more desirable since downsizing can be achieved when compared to an area of a P channel type transistor when exposed to a large current as in the above-described electric appliances. Further, while the preferred embodiments have been illustrated on the basis of a case in which the rectifier elements are diodes, it is also possible to use zener diodes.

Figure 14:
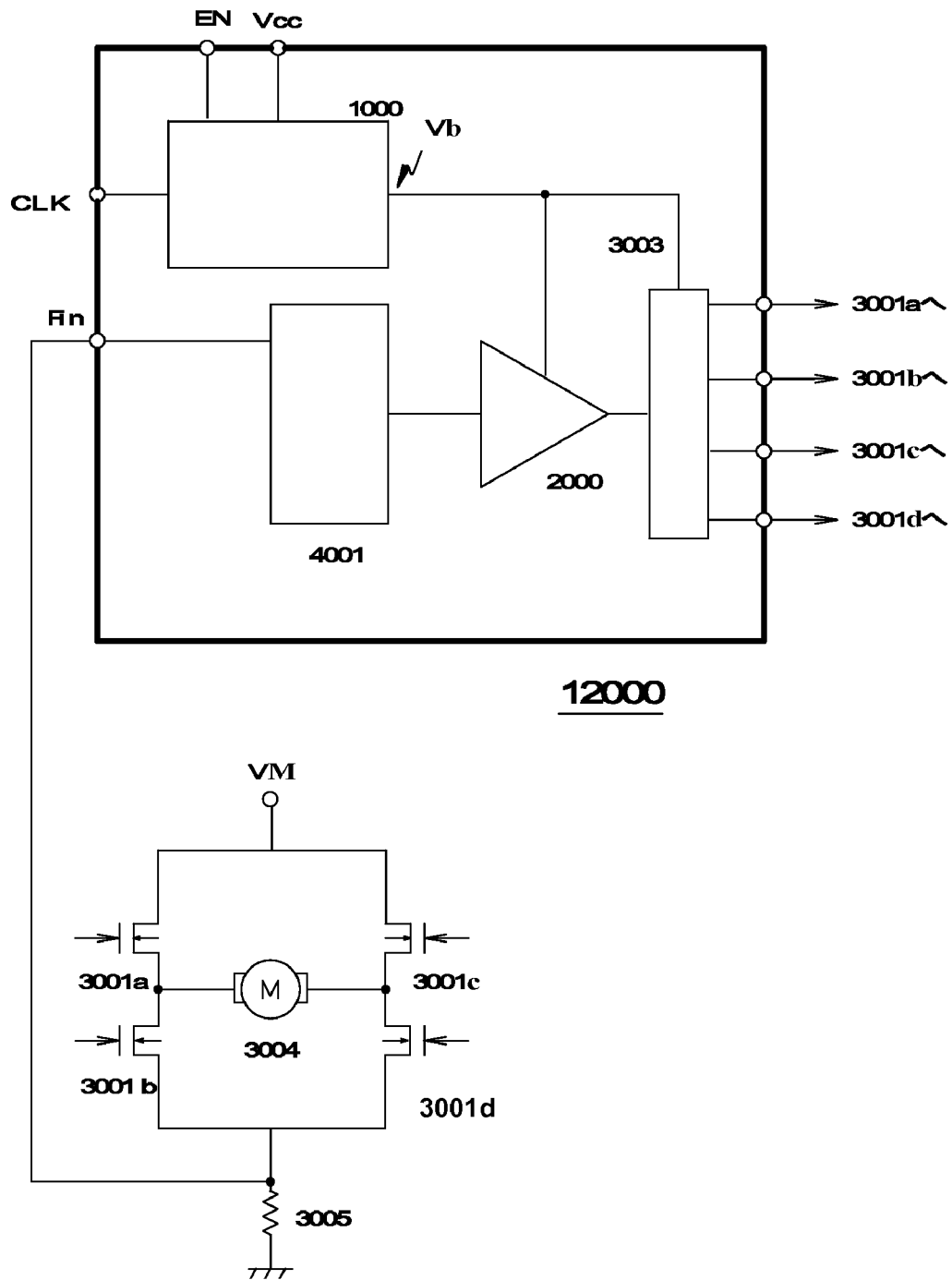
FIG. 14 is a circuit diagram of a motor appliance using the step-up circuit according to another preferred embodiment of the present invention.
Figure 15:
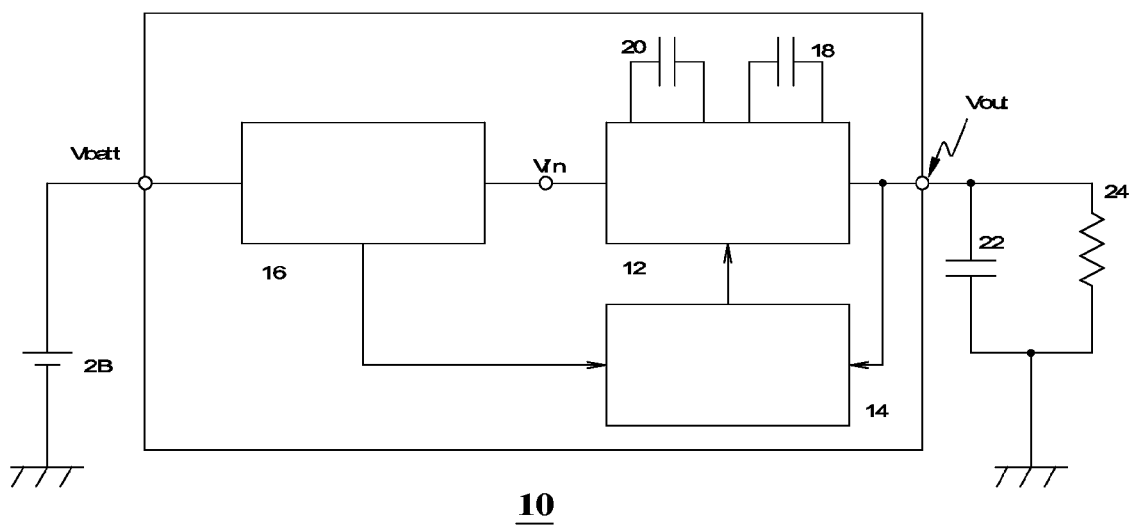
FIG. 15 is a circuit diagram of a conventional type step-up circuit.

FIG. 14 shows a motor control circuit device 12000 according to another preferred embodiment of the present invention. Explanations of portions that are identical to those of FIG. 13 will be omitted. The output terminals are provided with a switch control circuit 3003 for controlling respective switches 3001a to 3001d so that a motor 3004 can be driven by an H bridge circuit, wherein a resistance 3005 is provided between the H bridge circuit and the ground potential for return input to a switch drive control circuit 4001. While FIG. 14 illustrates an example in which an H bridge type control is performed as a method for controlling the motor, it is also possible to use a three-phase control type control.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic circuit comprising:
   a constant voltage output circuit arranged to output a constant voltage;
   a step-up circuit including an input portion to which outputs of the constant voltage output circuit are connected, the step-up circuit including at least two switches arranged to be controlled by a control circuit; and
   a delay circuit arranged to terminate operation of the electronic circuit at a second specified period of time after power activation; wherein
   the constant voltage output circuit includes an overcurrent detecting circuit arranged to detect overcurrent when current of not less than a specified value is supplied for not less than a first specified period of time, and an overcurrent protecting circuit arranged to perform operations of protecting the constant voltage output circuit based on outputs of the overcurrent detecting circuit.

2. The electronic circuit according to claim 1, wherein the step-up circuit includes:
   a control circuit arranged to output control signals based on inputs of clock signals which are of constant frequency;
   a group of rectifier elements arranged between the input portion and a voltage output portion in which N-number of rectifier elements are connected in series while anode terminals are connected to the input portion side;
   a first group of capacitive elements having first ends connected to cathode terminals of odd-numbered rectifier elements from the input portion side and having second ends arranged to receive input of first control signals that are output from the control circuit; and
   a second group of capacitive elements having first ends connected to cathode terminals of even-numbered rectifier elements from the voltage input portion side and having second ends arranged to receive input of second control signals having an inverse phase relative to that of the first control signals that are output from the control circuit; wherein
   the step-up circuit boosts the voltage input from the voltage input portion and outputs the boosted voltage from the voltage output portion in accordance with the first and second control signals.

3. The electronic circuit according to claim 2, wherein the overcurrent detecting circuit is arranged to start overcurrent detecting operations based on the first control signals or second control signals.

4. The electronic circuit according to claim 2, wherein the first specified period of time is a period of the control signals.

5. The electronic circuit according to claim 1, wherein the control circuit includes:
a sampling circuit to which periodic signals and signals corresponding to voltage fluctuations of the voltage output portion of the step-up circuit are input;
a comparison circuit arranged to compare first comparative signals that are based on returned signals and the periodic signals as output from the sampling circuit and second comparative signals that are based on the periodic signals and trigger signals as generated in the sampling circuit;
a drive circuit to which coincident signals as output from the comparison circuit and the trigger signals are input; and
a first switch and a second switch for outputting the first and second control signals, the first switch and the second switch being controlled by the drive circuit such that the first switch and the second switch become complementarily conductive/non-conductive when the returned signals and the trigger signals coincide and being controlled by the drive circuit to be both non-conductive when the returned signals and the trigger signals do not coincide.

6. An electronic circuit comprising:
a step-up circuit arranged to boost voltage as input from a voltage input portion and outputs the boosted voltage through voltage output terminals in accordance with first and second control signals, the step-up circuit including:
a control circuit arranged to output control signals based on inputs of clock signals that are of constant frequency;
a group of rectifier elements arranged between the voltage input portion and the voltage output portion of the step-up circuit in which N-number of rectifier elements are connected in series while anode terminals are connected to the input portion side;
a first group of capacitive elements having first ends connected to cathode terminals of odd-numbered rectifier elements from the voltage input portion side and having second ends arranged to receive input of the first control signals as output from the control circuit;
a second group of capacitive elements having first ends connected to even-numbered rectifier elements from the voltage input portion side and having second ends arranged to receive input of second control signals having an inverse phase relative to that of the first control signals that are output from the control circuit; wherein
the control circuit includes a sampling circuit to which periodic signals and signals corresponding to voltages of the voltage output portion of the step-up circuit are input;
a comparison circuit arranged to compare first comparative signals that are based on returned signals and the periodic signals as output from the sampling circuit, and second comparative signals that are based on the periodic signals and trigger signals as generated in the sampling circuit; and
a drive circuit to which coincident signals as output from the comparison circuit and the trigger signals are input, and a first switch and a second switch for outputting first and second control signals, the first switch and the second switch being controlled by the drive circuit such that the first switch and the second switch become complementarily conductive/non-conductive when the returned signals and the trigger signals coincide, and being controlled by the drive circuit that the first switch and the second switch become both non-conductive when the returned signals and the trigger signals do not coincide.

7. The electronic circuit according to claim 1, further comprising rectifier elements including:
a first-conductive type semiconductor substrate;
a first second-conductive type region provided on the semiconductor substrate;
a second second-conductive type region arranged below the first second conductive type region;
a first first-conductive type region arranged within the first second-conductive type region;
a third second-conductive type region arranged at an edge portion of the first second-conductive type region and contacts the second second-conductive type region at a lower end portion thereof;
a second first-conductive type region arranged within the first second-conductive type region between the first first-conductive region and the third second-conductive type region; wherein
first terminals are connected to the first second-conductive type region and wherein second terminals are connected to the third second-conductive type region and the second first-conductive type region.

8. The electronic circuit according to claim 7, wherein the first-conductive type is a P-type conductor and the second-conductive type is an N-type conductor, with anode terminals being connected to the first second-conductive type region and cathode terminals connected to the third second-conductive type region and the second first-conductive type region.

9. The electronic circuit according to claim 7, wherein the first-conductive type is an N-type conductor and the second-conductive type is a P-type conductor, with cathode terminals being connected to the first second-conductive type region and anode terminals connected to the third second-conductive type region and the second first-conductive type region.

10. An electronic circuit comprising:
the electronic circuit as claimed in claim 1;
a third switch including input terminals, output terminals and control terminals;
a switch drive circuit having input portions connected to outputs of the electronic circuit as claimed in claim 1 and driving the control terminals of the third switch at a voltage that is higher than the voltage applied to the input terminals of a first switch; and
a switch drive control circuit arranged to control the switch drive circuit.

11. An electronic appliance comprising:
a third switch including input terminals, output terminals and control terminals;
a switch drive circuit arranged to drive the control terminals of the third switch at a voltage that is higher than the voltage applied to input terminals of the third switch;
a switch drive control circuit arranged to control the switch drive circuit;
a fourth switch including control terminals to which signals opposite in phase to signals applied to the control terminals of the third switch are input, terminals that are connected to the output terminals, and terminals applied with a reference potential; and
the electronic circuit as claimed in claim 1 connected to the switch drive circuit.

12. A motor control circuit comprising:
a group of switches including a plurality of switches provided with input terminals, output terminals, and control terminals;
a switch drive circuit arranged to drive the control terminals of the switches at a voltage that is higher than the voltage applied to the input terminals of the switches of the groups of switches;
a switch drive control circuit arranged to control the switch drive circuit; and
the electronic circuit as claimed in claim 1 connected to the switch drive circuit; wherein
the switch drive circuit is arranged to control a motor that is controlled upon conduction/non-conduction of the groups of switches.

* * * * *